(12) United States Patent
Morioka

(10) Patent No.: US 7,550,394 B2
(45) Date of Patent: Jun. 23, 2009

(54) SEMICONDUCTOR DEVICE AND FABRICATION PROCESS THEREOF

(75) Inventor: Hiroshi Morioka, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 203 days.

(21) Appl. No.: 11/145,218

(22) Filed: Jun. 6, 2005

(65) Prior Publication Data

US 2006/0154488 A1     Jul. 13, 2006

(30) Foreign Application Priority Data

Jan. 7, 2005   (JP)   ............... 2005-002972

(51) Int. Cl.
*H01L 21/302* (2006.01)
(52) U.S. Cl. .......... 438/734; 216/63; 438/618; 438/707; 438/717; 438/714; 438/958; 430/323; 430/329; 156/643.1; 156/659.11
(58) Field of Classification Search ............ 216/63; 438/734; 430/329; 156/643.1
See application file for complete search history.

(56) References Cited

U.S. PATENT DOCUMENTS 5,423,941 A * 6/1995 Komura et al. ............. 438/700
5,605,600 A * 2/1997 Muller et al. ............... 438/695
6,103,585 A * 8/2000 Michaelis et al. ........... 438/386
6,692,903 B2 * 2/2004 Chen et al. .................. 430/329
6,849,389 B2 * 2/2005 Mahorowala ............... 430/317
7,030,027 B1 * 4/2006 Suzuki ........................ 438/710
2004/0157385 A1 * 8/2004 Ikezawa ...................... 438/197

FOREIGN PATENT DOCUMENTS

JP     2004-152784     5/2004

OTHER PUBLICATIONS

S. Wolf, Silicon Processing for the VLSI Era, vol. 4, Lattice Press, (2002) pp. 439-440.*
S.J. Pearton, Plasma Chemistry and Processing, vol. 14, No. 4, (1994) pp. 505-522.*

* cited by examiner

*Primary Examiner*—Nadine Norton
*Assistant Examiner*—Maki Angadi
(74) *Attorney, Agent, or Firm*—Westerman, Hattori, Daniels & Adrian, LLP.

(57) ABSTRACT

A method of fabricating a semiconductor device includes a dry etching process of a silicon surface. The dry etching process is conducted by an etching gas containing at least one gas species selected from the group consisting of: HBr, HCl, $Cl_2$, $Br_2$ and HI, wherein the dry etching process includes a first step conducted at a first temperature; and a second step conducted at a second temperature.

15 Claims, 8 Drawing Sheets

SEMICONDUCTOR DEVICE AND FABRICATION PROCESS THEREOF

CROSS-REFERENCE TO RELATED APPLICATION

The present application is based on Japanese priority application No. 2005-002972 filed on Jan. 7, 2005, the entire contents of which are hereby incorporated by reference.

BACKGROUND OF THE INVENTION

The present invention generally relates to semiconductor devices and more particularly to a fabrication method of semiconductor device that uses an anisotropic etching process and a semiconductor device fabricated by such a fabrication process.

Conventionally, polysilicon gate electrode of semiconductor devices is formed by an anisotropic dry etching process of a polysilicon film by using an RIE process.

With such an anisotropic dry etching process, Si atoms ejected from the polysilicon film with the etching process cause reaction with the etching gas to form a byproduct, and such a byproduct protects the sidewall surface of the gate electrode pattern from further etching as they are deposited on such a sidewall surface. As a result, the polysilicon gate electrode is formed in the state that it is defined by a pair of straight sidewall surfaces perpendicular to the substrate surface.

Further, such an anisotropic etching process has been used also for formation of STI (shallow trench isolation) structures that include a device isolation trench.

References

Reference 1 Japanese Laid-Open Patent Application 2004-152784

SUMMARY OF THE INVENTION

FIGS. 1A-1D show the method of forming a polysilicon gate electrode according to a related art that uses a conventional RIE process.

Referring to FIG. 1A, there is deposited a polysilicon film 13 on a silicon substrate 11 via a thermal oxide film 12 that functions as a gate insulation film, and a resist pattern corresponding to the desired polysilicon gate electrode is formed on the polysilicon film 13 by a photolithographic process.

Further, in the step of FIG. 1C, the polysilicon film 13 is patterned by an RIE process while using the resist pattern R1 as a mask, and a polysilicon gate electrode pattern 13G is formed as a result of the RIE process.

With such a dry etching process, it should be noted that the Si atoms ejected from the polysilicon film 13 as a result of the etching cause a reaction with the halogen etching gas admixed with oxygen, such as an HBr gas, and there occurs formation of a byproduct such as $SiBr_xO_y$, or the like, wherein such a byproduct functions as a sidewall protective film that protects the sidewall surface of the polysilicon gate electrode pattern 13G from further etching. As a result, the polysilicon gate electrode pattern 13G is formed to have a straight sidewall surface generally perpendicular to the principal surface of the silicon substrate 11.

Here, it should be noted that silicon of n-type has a higher reactivity than p-type, and thus, it is necessary to form such a sidewall protective film to have a larger thickness, when to form a gate electrode by patterning an n-type polysilicon film with good controllability of etching, as compared with the case of forming the same polysilicon gate electrode by patterning a p-type or non-doped polysilicon film.

The process of FIG. 1C is continued until the thermal oxide film 12 is exposed, wherein it is generally practiced to continue the dry etching process in the step of FIG. 1D (over etching) for ensuring that the polysilicon film 13 is removed from the surface of the thermal oxide film 12 completely except for the gate electrode 13G Meanwhile, the inventor of the present invention has discovered a problem that the shape of the sidewall surfaces of the gate electrode pattern 13G tends to become irregular as shown in FIGS. 2 and 3 when such ordinary patterning process of polysilicon gate electrode, which relies on the conventional RIE process, is applied for formation of the gate electrode having the gate length of 80 nm or less. Here, it should be noted that FIG. 3 is a diagram showing the sketch of the cross-section of the n-type polysilicon gate electrode of the photograph of FIG. 2.

Referring to FIGS. 2 and 3, it can be seen that the polysilicon gate electrode pattern 13G experiences erosion at the bottom part thereof. It is believed that such erosion of the sidewall surface of the polysilicon gate electrode is caused by dropping off of silicon crystal grains.

In the overetching process of Figure 1D, it should be noted that there no longer occurs substantial etching of fresh silicon film with the dry etching process, and thus, the supply of the reaction byproduct to the sidewall surface of the polysilicon gate electrode 13G as in the case of FIG. 1C should be depleted. It is believed that with such depletion of the reaction byproduct, the sidewall protective film, formed by the byproduct, is vanished, and this is the reason why lateral etching has been caused at the sidewall surface of the polysilicon gate electrode 13G as shown in FIGS. 2 and 3.

Because the lateral etching of the sidewall surface of the polysilicon gate electrode starts from where the sidewall protective film has vanished, the polysilicon gate electrode pattern can have various different shapes other than those shown in FIGS. 2 and 3, such as the one shown in FIG. 4.

It is possible that such lateral etching at the sidewall surface of the polysilicon gate electrode has already been caused at the time of the over etching process in the conventional fabrication process of conventional semiconductor devices that have a gate length exceeding 100 nm. However, this problem has never attracted attention probably because the effect of such lateral etching only causes negligible effect with such a conventional semiconductor device having the gate length exceeding 100 nm.

On the other hand, with the semiconductor devices having the gate length of 100 nm or less, such irregular lateral etching occurring at the sidewall surfaces of the gate electrode is not ignorable at all, as such irregularity may cause substantial change of device characteristics such as deviation of gate length from the designed value, increase of gate resistance, and the like.

As noted previously, the problem of lateral etching at the time of patterning of the polysilicon gate electrode becomes particularly serious when patterning an n-type polysilicon gate electrode pattern, in which the reactivity of the n-type polysilicon film is large and thus a thick sidewall protection film is required.

This further means that there may even be a possibility that the polysilicon gate electrode pattern shape may be different between the p-type polysilicon gate electrode and n-type polysilicon gate electrode even when the p-type polysilicon film and the n-type polysilicon film are formed on a common silicon substrate and patterned at the same time, due to the enhanced sidewall lateral etching in the n-type polysilicon gate electrode at the time of the overetching step of FIG. 1D.

In a first aspect, the present invention provides a method of fabricating a semiconductor device comprising a dry etching process of a silicon surface, said dry etching process being conducted by an etching gas containing at least one gas species selected from the group consisting of: HBr, HCl, $Cl_2$, $Br_2$ and HI, said dry etching process comprising a first step conducted at a first temperature and a second step conducted at a second temperature.

In another aspect, the present invention provides a dry etching method of a silicon surface, comprising: a first step conducted at a first temperature; and a second step conducted at a second temperature, said first and second steps being conducted by an etching gas containing at least one gas species selected from the group consisting of HBr, HCl, $Cl_2$, $Br_2$ and HI, wherein a deposition gas containing one or both of oxygen and sulfur is added to said etching gas.

According to the present invention, the sidewall surface of the structure formed by the dry etching process is effectively protected from etching by changing the temperature in the second step of the dry etching process or by adding a deposition gas containing oxygen and not attacking the deposits on the sidewall surface of the foregoing structure, to the etching gas in the foregoing second step.

Thus, in the case of forming a polysilicon gate electrode by such a dry etching process, the problem of attacking of the sidewall surface of the gate electrode associated with the overetching process is successfully suppressed by conducting the overetching process after the patterning of the polysilicon gate electrode in the form of the foregoing second step, and it becomes possible to obtain a polysilicon gate electrode of desired cross-sectional shape with desired gate length.

Further, in the case of forming a device isolation trench in a silicon substrate, too, it becomes possible to form a tapered part forming a shallow angle at the bottom part of the device isolation trench by forming the main part of the device isolation trench in the foregoing first step and then conducting the dry etching process comprising the foregoing second step. With this, the withstand voltage of the device isolation trench is improved and filling of the device isolation trench by a CVD insulation film is facilitated.

Other objects and further features of the present invention will become apparent from the following detailed description when read in conjunction with the attached drawings.

DETAILED DESCRIPTION OF THE INVENTION

First Embodiment

Figure 5A:
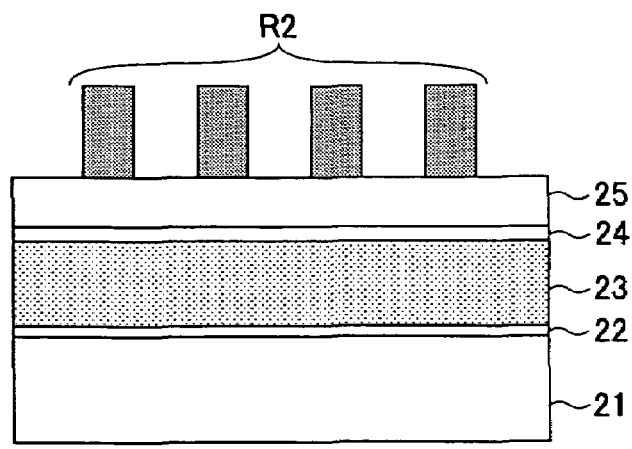
FIGS. 5A-5D are diagrams showing the dry etching process of a polysilicon gate electrode according to a first embodiment of the present invention.

FIGS. 5A-5 are diagrams showing the formation of a polysilicon gate electrode pattern according to a first embodiment of the present invention.

Referring to FIG. 5A, a polysilicon film 23 is formed on a silicon substrate with a thickness of about 100 nm via a silicon oxide film or a silicon oxynitride film 22 having a thickness of 1-2 nm, and a silicon oxide film 24 acting as a hard mask is formed on the polysilicon film 23 with the thickness of about 30 nm. Further, an organic antireflection coating (BARC) 25 is formed on the hard mask film 24, and a resist pattern R2 is formed on the BARC 25 with the shape of the gate electrode pattern to be formed.

Figure 5B:
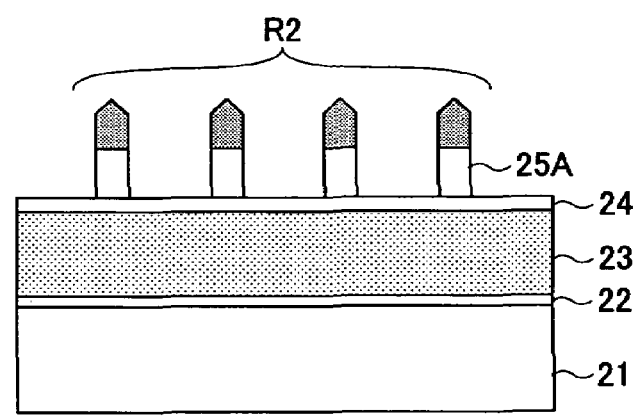

Next, in the step of FIG. 5B, the structure of FIG. 5A is introduced into a plasma etching apparatus of ICP type, for example, and the BARC 25 is subjected to an etching process in a mixed gas ambient of $He/O_2/SO_2$ while using the resist pattern R2 as a mask.

More specifically, the etching of the BARC 25 is conducted at the substrate temperature of 20° C. under the pressure of 5 mTorr (665 mPa) while supplying a He gas, an oxygen gas and a $SO_2$ gas with respective flow rates of 60 SCCM, 20 SCCM and 10 SCCM and inducing plasma in the processing space by an RF power of 300 W. Thereby, a bias voltage of 100V is applied to the stage holding the substrate 21 by supplying thereto a high frequency power of 25 W. As a result, the BARC 25 is patterned as shown in FIG. 5B and a BARC pattern 25A corresponding to the gate electrode pattern to be formed is formed on the hard mask film 24.

Figure 5C:
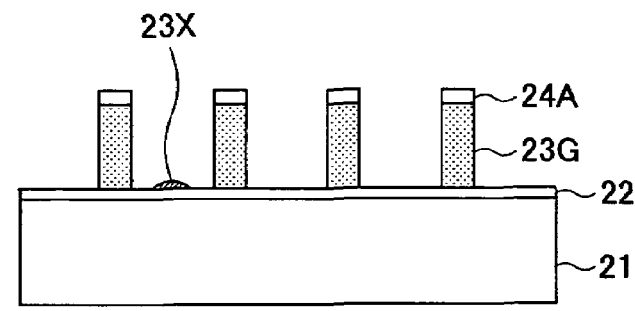

Further, in the step of FIG. 5B, the resist pattern R2 is subjected to trimming, and in the step of FIG. 5C, the foregoing hard mask film 24 is patterned while using the resist pattern R2 as a mask. Thereby, a hard mask pattern 24A is formed as a result.

Further, in the step of FIG. 5C, the polysilicon film 23G is patterned while using the hard mask pattern 24A as a mask, and a desired polysilicon gate electrode pattern 23G is formed.

In the step of FIG. 5C, the patterning of the hard mask 24 is conducted for example at the substrate temperature of 20° C. under the pressure of 5 mTorr (665 mPa) while supplying a $CF_4$ gas with a flow rate of 100 SCCM and inducing plasma with an RF power of 300 W. Thereby, etching is made by applying a bias voltage of 100V to the stage holding the substrate 21 by supplying a high-frequency power of 25 W thereto.

Here, it should be noted that etching of the polysilicon film 25 is conducted in two successive etching steps of different conditions, the first being conducted at the substrate temperature of 60° C. under the pressure of 12 mTorr (about 1.6 Pa) while supplying a $Cl_2$ gas, an HBr gas, a $CF_4$ gas, and an oxygen gas with respective flow rates of 100 SCCM, 250 SCCM, 150 SCCM and 10 SCCM. Thereby, plasma is induced by an RF power of 500 W and etching is conducted by providing a high-frequency bias power of 34 W to the stage holding the substrate 21. This first dry etching process may be continued for 21 seconds.

On the other hand, the second etching step is conducted at the same substrate temperature of 60° C. under the pressure of 6 mTorr (about 0.8 Pa) while supplying a HBr gas and an oxygen gas with respective flow rates of 180 SCCM and 5 SCCM and inducing plasma by supplying an RF power of 350 W. Thereby, the stage holding the substrate 21 is supplied with a high-frequency bias power of 18 W, and the second etching step may be continued for 21 seconds.

Because oxygen is added to the etching gas used for etching the polysilicon film 23, the dry etching stops upon exposure of the gate insulation film 22 in the dry etching step of FIG. 5C. On the other hand, in the state of FIG. 5C in which the gate insulation film 22 has just been exposed, there can be a case that a polysilicon residue 23X remains on the gate insulation film 22 because of variation of the etching rate, or the like.

Figure 5D:
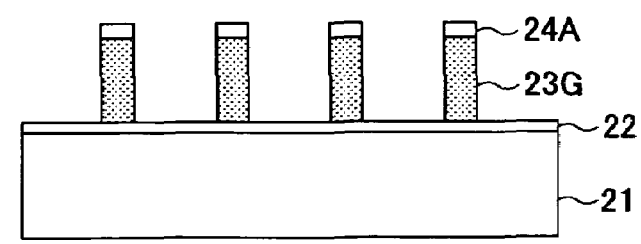

Thus, in the present invention, overetching is conducted further in the step of FIG. 5D for removing such a residue 23X completely, wherein the present embodiment changes the substrate temperature and the etching gas composition in such an overetching process that the polysilicon gate electrode pattern 23G is not subjected to lateral etching.

More specifically, the overetching process of FIG. 5D is conducted by lowering the substrate temperature from 60° C. of FIG. 5C to 20° C. and further by adding an $SO_2$ gas to the etching gas. Thus, an HBr gas, a He gas and an $SO_2$ gas are supplied with respective flow rates of 150 SCCM, 150 SCCM and 5 SCCM in the step of FIG. 5D, and the overetching process is conducted under the pressure of 80 mTorr (about 10.7 Pa) for the duration of 40 seconds by inducing plasma with the RF power of 350 W and applying a high-frequency bias power of 65 W to the stage holding the substrate 21.

Figure 1A:
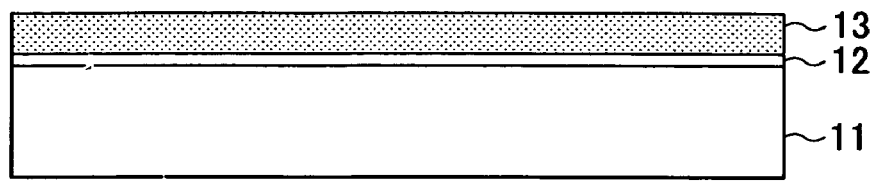
FIGS. 1A-1D are diagrams showing a conventional dry etching process of a polysilicon gate electrode.
Figure 1B:
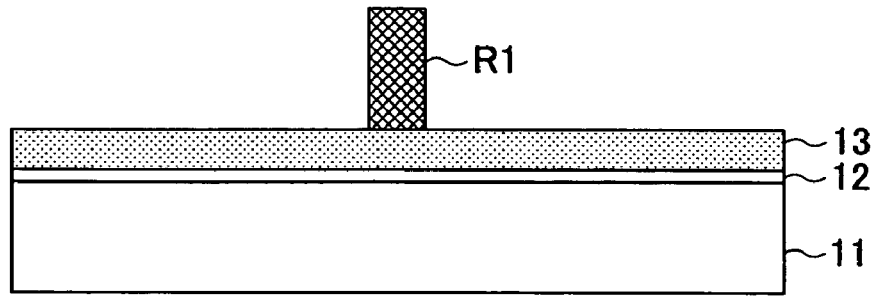
Figure 1C:
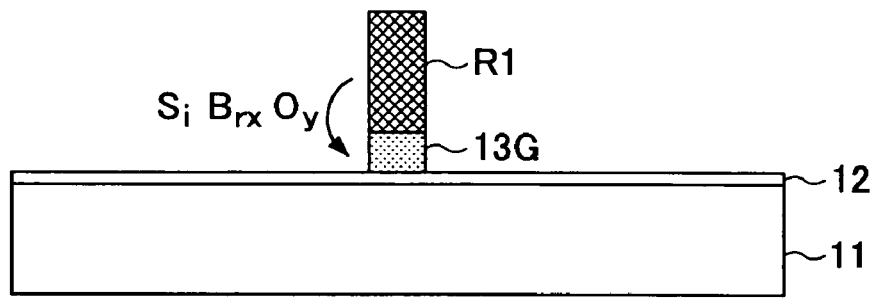
Figure 1D:
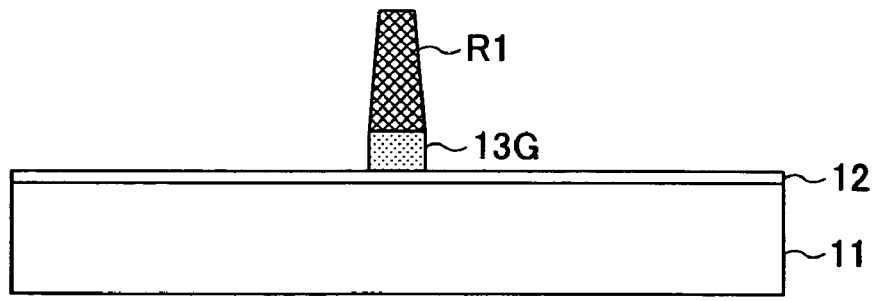
Figure 2:
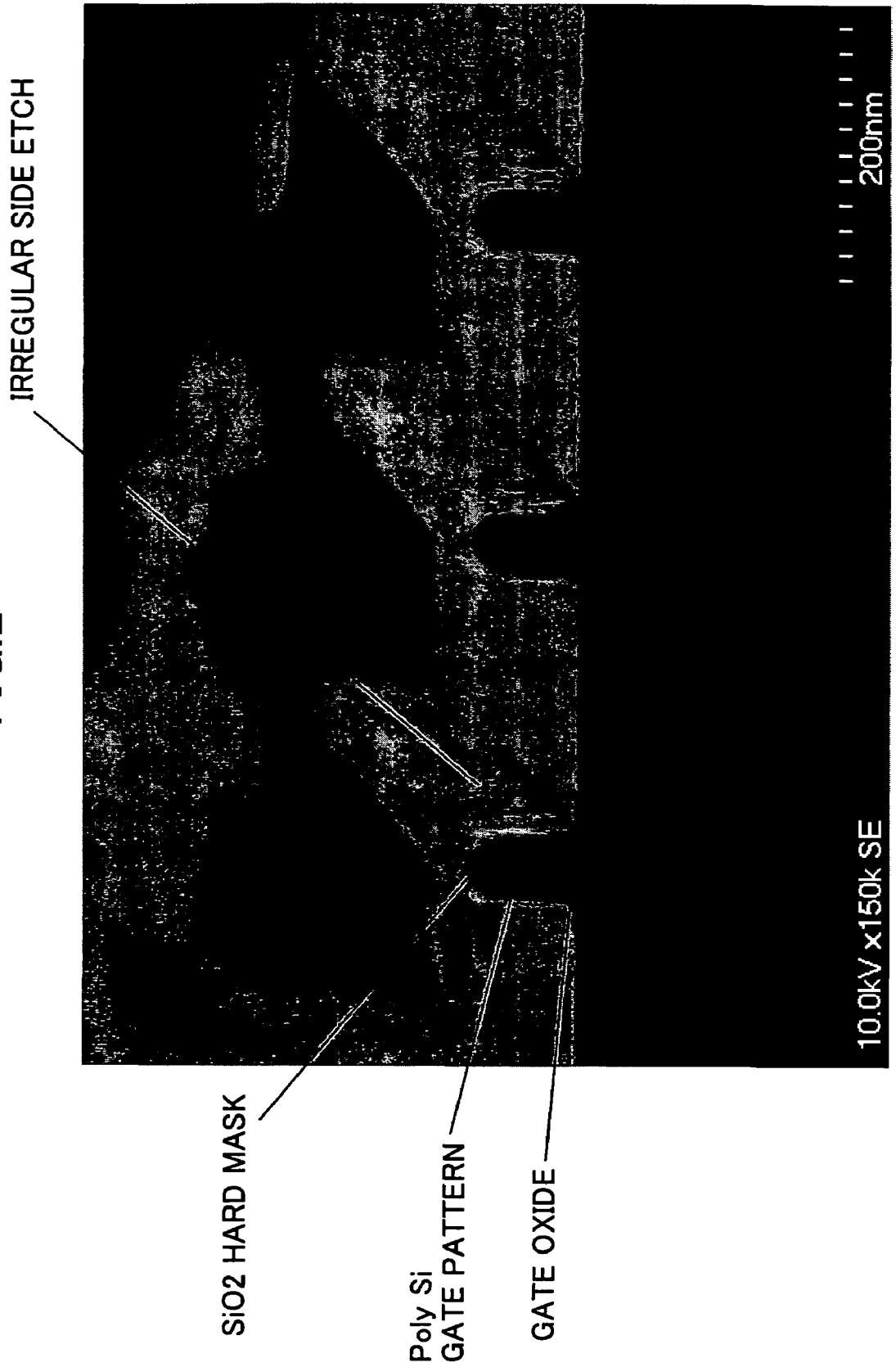
FIG. 2 is a diagram showing the problem of the conventional dry etching process of the polysilicon gate electrode.
Figure 3:
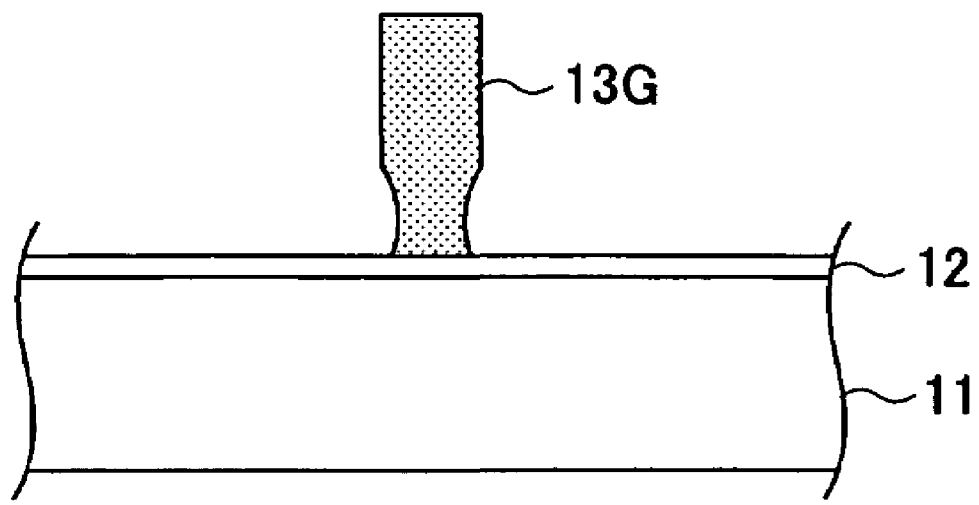
FIG. 3 is a diagram showing the problem of FIG. 2 schematically.
Figure 4:
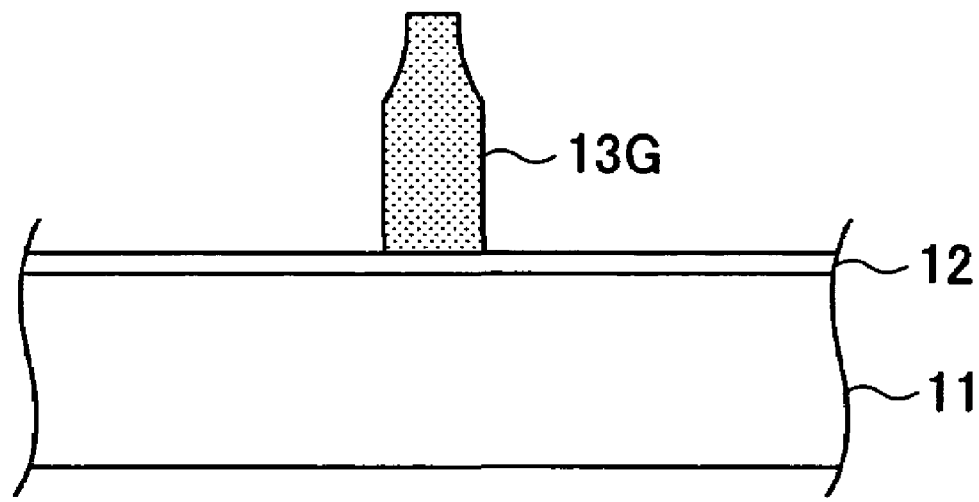
FIG. 4 is another diagram showing the problem of FIG. 2 schematically.

By conducting the overetching of FIG. 5D with such a low substrate temperature while adding $SO_2$ to the etching gas, the sidewall surface of the polysilicon gate electrode pattern 23G is protected by a deposit primarily of sulfur (S), and the problem of irregular lateral etching of the sidewall surface of the gate electrode pattern explained with reference to FIG. 3 or 4 is effectively avoided.

Figure 6:
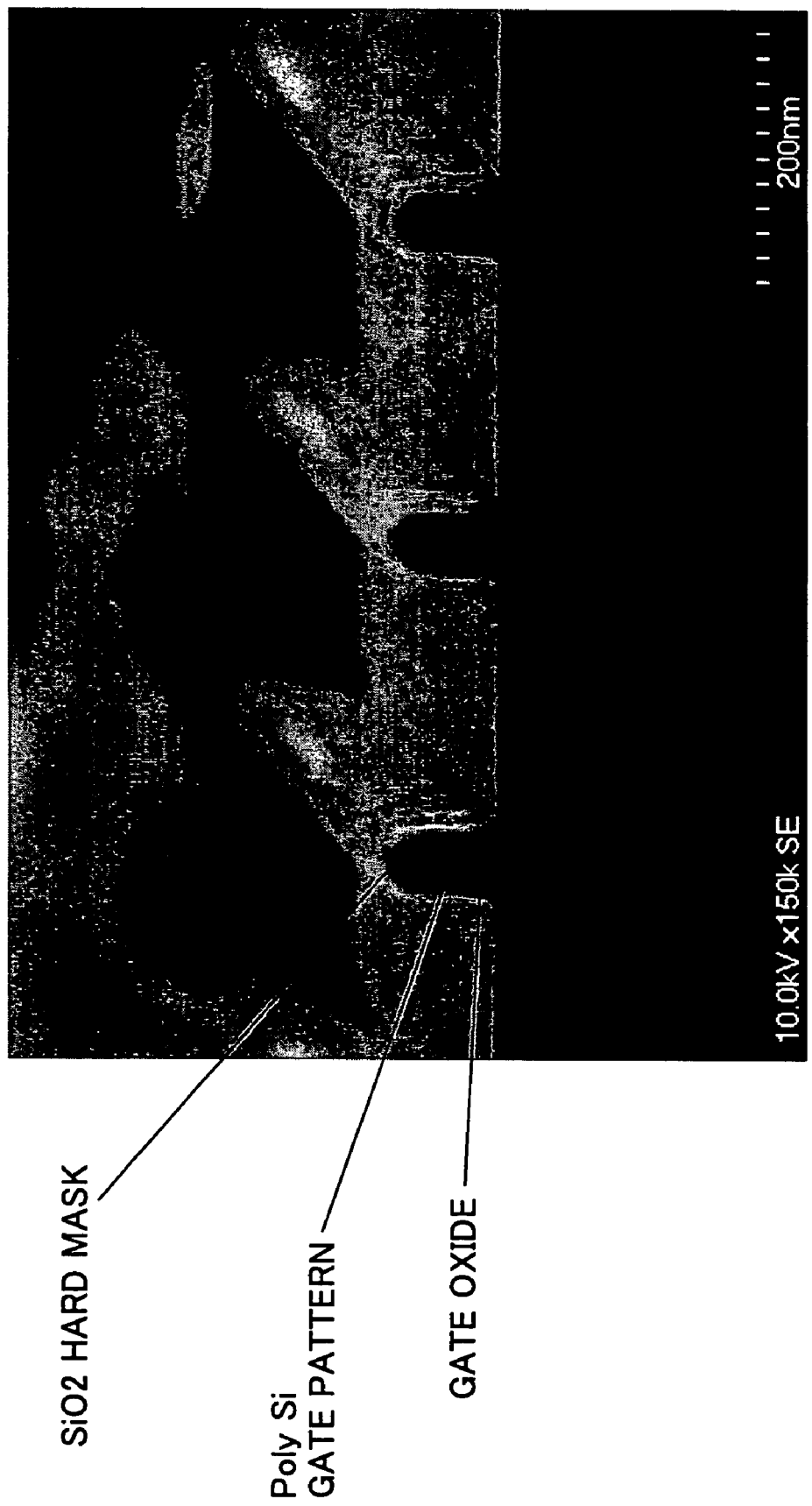
FIG. 6 is a diagram showing the cross-section of a polysilicon gate electrode patterned according to the steps of FIGS. 5A-5D.

FIG. 6 shows the cross-sectional structure of the n-type polysilicon gate electrode formed with the overetching process of FIG. 5D.

Referring to FIG. 6, it can be seen that there is caused no sidewall etching that may cause a change of gate length in the polysilicon gate electrode obtained with such a process.

In the overetching process of FIG. 5D it is also possible to add an oxygen gas in addition to the $SO_2$ gas, which already contains oxygen.

Because the etching gas used for the overetching process of FIG. 5D thus contains oxygen, etching selectivity is secured for the exposed gate insulation film 22, and damaging of the gate insulation film 22 such as erosion is successfully avoided even in the case the gate insulation film has an extremely small thickness such as 2 nm or less in correspondence to the extremely reduced gate length of ultrafine semiconductor devices.

In the overetching process of FIG. 5D, it is also possible to use a film-forming sulfuric carbonyl gas or hydrogen sulfide gas together with an oxygen gas. Further, in the overetching step of FIG. 5D, it is also possible to use an alkyl compound gas such as ethylene ($C_2H_4$) in place of the $SO_2$ gas together with the oxygen gas. In this case, the sidewall surface of the polysilicon gate electrode pattern is protected by a deposit primarily formed of carbon (C).

Further, it should be noted that the overetching step of FIG. 5D is effective not only for the polysilicon gate electrode pattern but also in the overetching of an amorphous silicon pattern for suppressing appearance of irregular cross-sectional structure.

Second Embodiment

FIGS. 7A-7G are diagrams showing the fabrication process of a CMOS device according to a second embodiment of the present invention.

Figure 7A:
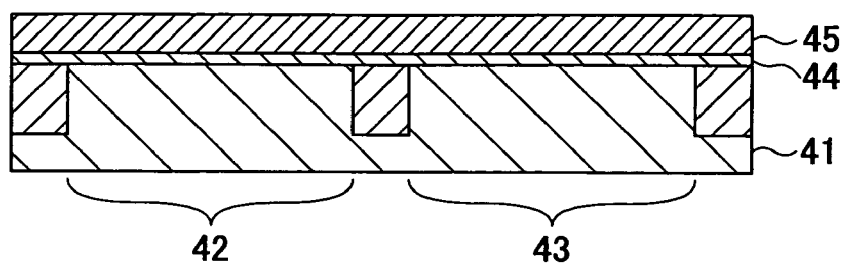
FIGS. 7A-7G are diagrams showing the fabrication process of a CMOS device according to a second embodiment of the present invention.

Referring to FIG. 7A, a silicon substrate 41 is defined with a device region 42 of p-type well for an n-channel MOS transistor and a device region 43 of n-type well for a p-channel MOS transistor by an STI device isolation structure, and an SiON film 44 is formed commonly on the device regions 42 and 43 as a gate insulation film with a thickness of 1.5 nm. Further, a polysilicon film 45 constituting the gate electrode is formed on the SiON film 44 with a thickness of 120 nm.

Figure 7B:
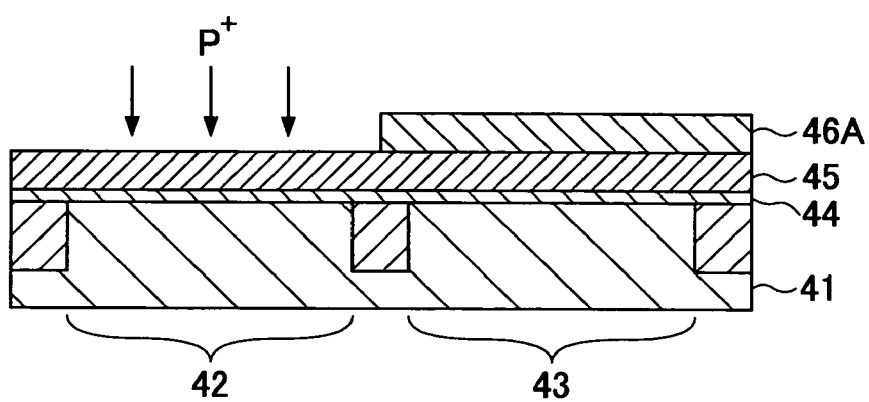

Next, in the step of FIG. 7B, the part of the polysilicon film 45 located on the device region 43 of the p-channel MOS transistor is covered with a resist pattern 46A, and ion implantation of phosphor (P) is conducted into the part of the polysilicon film 45 located on the device region 42 of the n-channel MOS transistor under the acceleration voltage of 10 keV with a dose of $8 \times 10^{15}$ $cm^{-2}$. Thereby, the foregoing part of the polysilicon film 45 is doped to n-type.

Figure 7C:
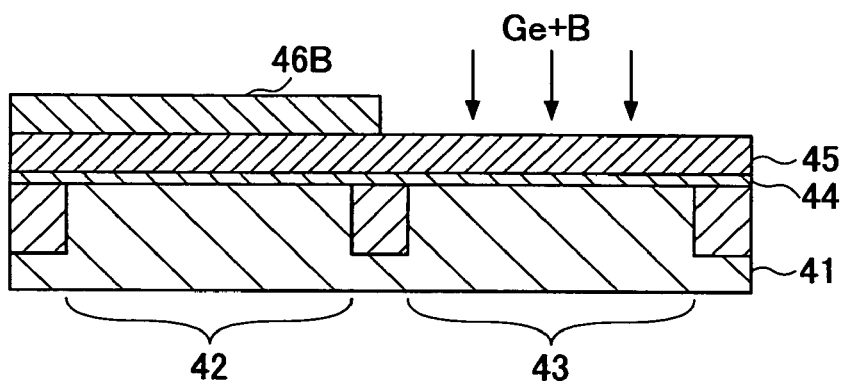

Next, in the step of FIG. 7C, the part of the foregoing polysilicon film 45 located on the device region 42 of the n-channel MOS transistor is covered with a resist pattern 46B, and Ge is injected thereto by an ion implantation first with the acceleration voltage of 20 keV with the dose of $1 \times 10^{15}$ $cm^{-2}$. With this, the polysilicon film 45 is converted to an amorphous film.

Further, in the step of FIGS. 7C, B (boron) is injected into the polysilicon film 45 thus converted to amorphous phase under the acceleration of 5 keV with the dose of $2 \times 10^{15}$ $cm^{-2}$ to dope the polysilicon film 45 thus converted to amorphous phase to p-type.

Figure 7D:
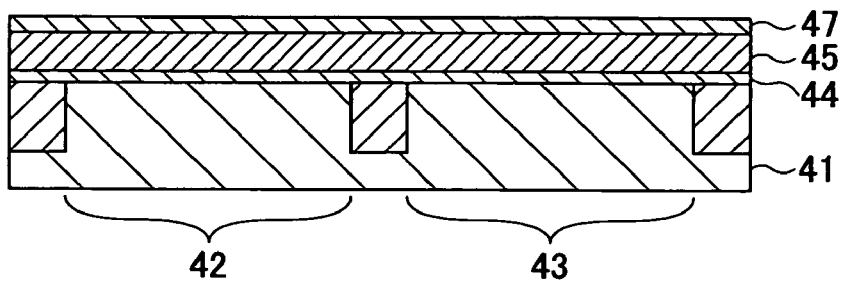

Next, in the step of FIG. 7D, the resist pattern 46B is removed and a TEOS oxide film 47 is deposited on the polysilicon film 45 by a CVD process at the substrate temperature of 620° C. with the thickness of 30 nm. Thereby, it is possible to activate the p-type or n-type impurity element introduced into the polysilicon film in the step of FIG. 7B, 7C or 7D.

Figure 7E:
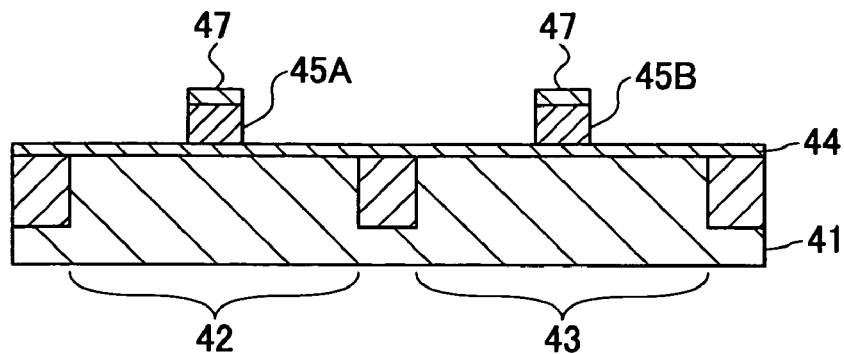

Next, in the step of FIG. 7E, the TEOS oxide film 47 is patterned in accordance with the desired shape of the gate electrodes of the p-channel and n-channel MOS transistors, and the polysilicon film 45 is patterned further while using the TEOS oxide film 47 thus patterned as a hard mask. Thereby, an n-type polysilicon gate electrode 45A is formed in the device region 42 and the p-type polysilicon gate electrode 45B is formed on the device region 43.

It should be noted that this step of forming the polysilicon gate electrodes 45A and 45B is conducted by using a recipe explained previously with reference to FIG. 5C, and an overetching process explained with reference to FIG. 5D is applied thereafter.

With the present invention, it becomes possible to effectively suppress the change of shape and size of the polysilicon gate electrodes 45A and 45B with the overetching in any of the n-type polysilicon gate electrode 45A and the p-type polysilicon gate electrode 45B, by conducting the overetching process at a lower substrate temperature and by admixing $SO_2$ to the etching gas.

In the step of FIG. 7E, In (indium) ions are injected obliquely into the device region 42 four times from four directions each time with the angle of 25° while using the polysilicon gate electrode 45A as a self-alignment mask, and pocket injection region (not illustrated) is formed. Further, while using the polysilicon gate electrode 45A again as a self-alignment mask, As (arsenic) ions are injected into the device region 42 to form n-type source/drain extension regions 61 at both lateral sides of the n-type polysilicon gate electrode 45A.

Further, in the step of FIG. 7E, As ions are injected obliquely into the device region 43 four times from four directions each time with the angle of 25° while using the polysilicon gate electrode 45B as a self-alignment mask, and pocket injection region (not illustrated) is formed. Further, while using the polysilicon gate electrode 45B again as a self-alignment mask, B (boron) ions are injected into the device region 43 to form p-type source/drain extension regions 62 at both lateral sides of the p-type polysilicon gate electrode 45B.

Figure 7F:
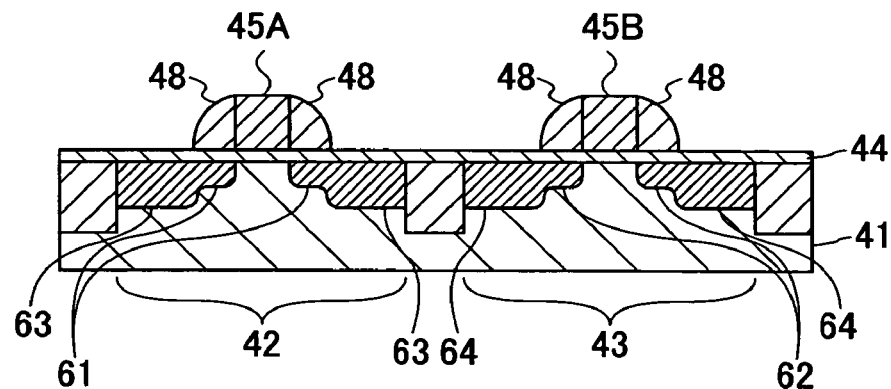

Further, in the step of FIG. 7F, sidewall insulation films 48 are formed on the polysilicon gate electrodes 45A and 45B, and P (phosphorus) ions are injected to the device region 42 while using the polysilicon gate electrode 45A and sidewall film 48 as a self-aligned mask. With this, source/drain diffusion regions 63 of the n-channel MOS transistor are formed in a partially overlapping relationship with the source/drain extension regions 61. Further, B ions are injected to the device region 43 while using the polysilicon gate electrode 45B and sidewall film as a self-aligned mask. With this, source/drain diffusion regions 64 of the p-channel MOS transistor are formed in a partially overlapping relationship with the source/drain extension regions 62.

Figure 7G:
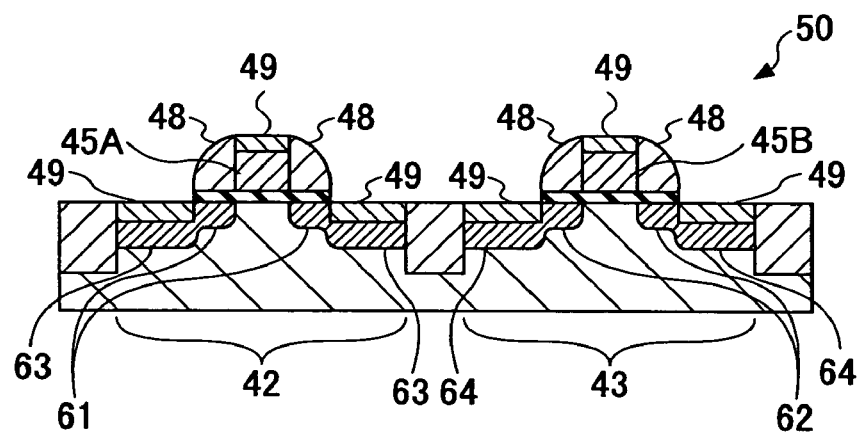

Further, in the step of FIG. 7G, $CoSi_2$ layers 49 are formed on the polysilicon gate electrodes 45A and 45B and on the exposed surfaces of source/drain diffusion regions 63 and 64.

With the CMOS device fabricated according to such a process, there occurs no erosion at the sidewall surfaces of the polysilicon gate electrode patterns 45A and 45B even when the overetching is applied in the step of FIG. 7E, and the semiconductor device shows stable operational characteristics even when the gate length is reduced to less than 100 nm, such as 50 nm or 40 nm.

Third Embodiment

It should be noted that the dry etching process of the present invention is effective not only for patterning a polysilicon film to form a gate electrode but also for formation of an STI structure in a silicon substrate formed of a single crystal silicon.

FIGS. 8A-8D show the method of forming a device isolation trench in a silicon substrate 81 conducted in an ICP plasma etching apparatus according to a third embodiment of the present invention.

Figure 8A:
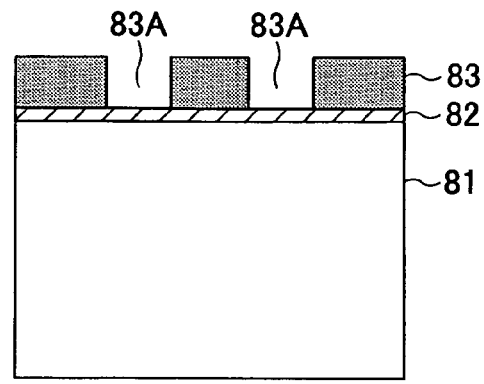
FIGS. 8A-8D are diagrams showing the formation process of an STI device isolation structure according to a third embodiment of the present invention.

Referring to FIG. 8A, there is formed an SiN film 83 on a silicon substrate 81 with a thickness of about 110 nm via an intervening thermal oxide film 82 having a thickness of about 10 nm, and an opening 83A is formed in a part of the SiN film 83 in correspondence to where the desired device isolation trench is to be formed.

In the present embodiment, the silicon substrate 81 of the state of FIG. 8A is held in the ICP plasma etching apparatus (not illustrated) at a substrate temperature of 60° C., and the thermal oxide film 82 is removed with regard to the silicon substrate 81 at the foregoing opening by a dry etching process conducted at the substrate temperature of 60° C. under the pressure of 5 mTorr (665 mPa) while supplying a $CF_4$ gas with the flow rate of 100 SCCM and inducing plasma with an RF power of 200 W. Further, a high-frequency bias of 400 volt (peak volt) is applied to the stage holding the substrate, and the dry etching process is conducted for 10 seconds.

Figure 8B:
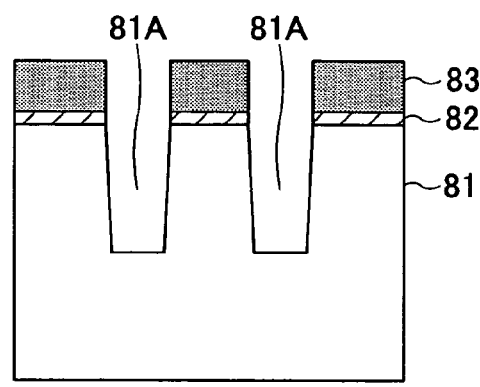

Next, in the step of FIG. 8B, the silicon substrate 81 of FIG. 8A is held in the same ICP plasma etching apparatus at the substrate temperature of 60° C., and the silicon substrate 81 are removed by a dry etching process over the duration of 30 seconds while using the SiN film 83 as a mask, by supplying a HBr gas and an oxygen gas with respective flow rates of 450 SCCM and 13 SCCM and inducing plasma by an RF power of 900 W while applying a high-frequency bias having a peak voltage of 220V. With this, there is formed a device isolation trench 81A in the silicon substrate 81 in correspondence to the openings 81.

Figure 8C:
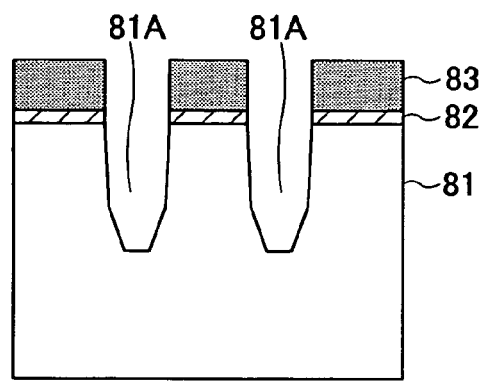

After formation of the device isolation trench 81A in the dry etching process of FIG. 8B, the dry etching process is continued in the step of FIG. 8C with the present embodiment but with a modified dry etching condition.

In more detail, the substrate temperature is reduced to 40° C. in the same ICP plasma etching apparatus in the step of FIG. 8C, and the plasma etching is continued under the pressure of 10 mTorr (1.3 Pa) while supplying a HBr gas, an oxygen gas and a $SO_2$ gas with respective flow rates of 450 SCCM, 7 SCCM and 6 SCCM. Further, plasma is induced by an RF power of 900 W and a high-frequency bias having a peak voltage of 250V is applied to the stage holding the substrate. In this state, the dry etching is continued for about 15 seconds.

With this, more deposits are formed on the sidewall surface of the device isolation trench 81A, which increases the depth thereof with the progress of etching, as compared with the case of the step of FIG. 8B, and as a result, there is formed a tapered part of shallower angle at the bottom of the device isolation trench 81A. In FIG. 8B, this tapered part is not shown clearly.

In the step of FIG. 8C, the substrate temperature is lowered further to 20° C., and dry etching is continued under the pressure of 10 mTorr (1.3 Pa) while supplying a HBr gas, an oxygen gas and a $SO_2$ gas with respective flow rates of 450 SCCM, 7 SCCM and 6 SCCM and inducing plasma with an RF power of 900 W. Thereby, a high-frequency bias having a peak voltage of 250V is provided and the dry etching is continued for 15 seconds. With this, a tapered part characterized by further smaller tapered angle is formed at the bottom of the device isolation trench 81A.

The device isolation trench 81A thus formed may have a width of 140 nm corresponding to the design rule and a depth of about 300 nm.

Figure 8D:
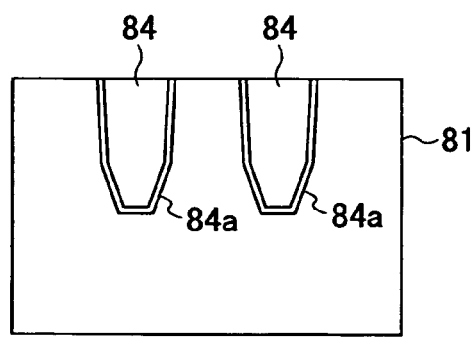

Further, in the step of FIG. 8D, the SiN film 83 and the thermal oxide film 82 are removed and a thermal oxidation processing is applied to form a thermal oxide film 84a on the surface of the device isolation trench 81A. And, by filling the device isolation trench 81A thus covered with the thermal oxide film 84a by a CVD oxide film 84, the desired STI structure is completed.

It should be noted that the STI structure formed according to such a process may be used for the device isolation structure of the CMOS device explained in the previous embodiment.

With the STI device isolation structure of such a construction, filling of the trench 81A with the CVD oxide film 84 is made easily in view of the shallow tapered angle at the bottom part of the device isolation trench 81A, and fabrication of the semiconductor device is made easily. Further, withstand voltage at the bottom part of the device isolation trench 81A is improved, while this results in improvement of device isolation characteristics.

While the process of FIGS. 8A-8D is particularly effective for forming a device isolation trench in an n-type well such as the device region 43 of FIG. 7A, the process of FIGS. 8A-8D is useful also at the time of forming the device isolation trenches in the n-type well (device region 43 of FIG. 7A) and in the p-type well (device region 42 of FIG. 7A) simultaneously.

Further, it is also possible to form a DRAM by forming a trench in a silicon substrate by a process similar to that of FIGS. 8A-8D and by forming a capacitor in such a trench. In this case, leakage of electric charges at the bottom part of the trench capacitor is reduced because of the round shape of the trench bottom surface. Thereby, use of long refreshing time becomes possible.

Thus, the dry etching process of the present invention is useful not only in the formation of STI structure but also in the fabrication of DRAMs.

In the description heretofore, the use of the ICP plasma etching apparatus has been assumed. However, the present invention is by no means limited to such a particular plasma etching apparatus but it is also possible to use other generally used plasma etching apparatuses including parallel plate type apparatus.

Further, the present invention is not limited to a particular embodiment but various variations and modifications may be made without departing from the scope of the invention.

What is claimed is:

1. A method of forming a shallow trench device isolation structure, in which a device isolation trench in a silicon substrate is filled with an insulation film, said method comprising a step of forming said device isolation trench in said silicon substrate by a dry etching process of said silicon substrate, and filling the insulation film in the device isolation trench,
wherein said dry etching process is conducted by an etching gas containing at least one gas specie selected from the group consisting of: HBr, HCl, $Cl_2$, $Br_2$ and HI,
said dry etching process comprising: a first step conducted at a first temperature; and
a second step conducted at a second temperature,
wherein said second temperature is lower than said first temperature,
said first step of said dry etching process forming a first trench part in said silicon substrate in correspondence to said device isolation trench,
said second step of said dry etching process forming a second, tapered trench part at a bottom of said first trench part, said second trench part forming a shallower angle than said first trench part forming a shallower angle than said first trench part with regard to a surface of said silicon substrate and having a tapered shape, said second trench part having a second width at a bottom thereof such that said second width is smaller than a first width at said bottom of said first trench part.

2. The method as claimed in claim 1, wherein said first temperature is 40° C. or higher and said second temperature is 40° C. or lower.

3. The method as claimed in claim 1, wherein said second step of said dry etching process is conducted by adding a depositing gas containing oxygen and sulfur to said etching gas. higher and said second temperature is 40° C. or lower.

4. The method as claimed in claim 3, wherein said depositing gas comprises a $SO_2$ gas.

5. The method as claimed in claim 1, wherein said second step of dry etching process is conducted by adding an oxygen gas and any of a sulfuric carbonyl gas or a hydrogen sulfide gas to said etching gas.

6. The method as claimed in claim 1, wherein said second step of said dry etching process is conducted by adding an oxygen gas and an alkyl compound gas to said etching gas.

7. The method as claimed in claim 1, wherein said first step and second step of said dry etching process are conducted in continuation in an identical processing vessel.

8. The method as claimed in claim 1, wherein said silicon surface comprises any of a single crystal surface, a polysilicon surface and an amorphous silicon surface.

9. A method of fabrcating a semiconductor device comprising a dry etching process of a silicon surface,
said dry etching process being conducted by an etching gas containing at least one gas specie selected from the group consisting of: HBr, HCl, $Cl_2$, $Br_2$ and HI,
said dry etching process comprising: a first step conducted at a first temperature; and
a second step conducted at a second temperature,
wherein said second temperature is lower than said first temperature,
said dry etching process being a process of forming a polysilicon gate electrode on insulation film,
said first step of said dry etching process comprising the step of pattering a polysilicon film on an insulation film constituting said gate insulation film until said gate insulation film is exposed to form a polysilicon pattern corresponding to said polysilicon gate electrode,
said second step comprising the step of overetching said polysilicon pattern.

10. The method as claimed in claim 9, wherein said polysilicon gate electrode comprising n-type polysilicon.

11. A method of fabrcating a semiconductor device comprising a dry etching process of a silicon surface,
said dry etching process being conducted by an etching gas containing at least one gas specie selected from the group consisting of: HBr, HCl, $Cl_2$, $Br_2$ and HI,
said dry etching process comprising: a first step conducted at a first temperature; and
a second step conducted at a second temperature,
wherein said second temperature is lower than said first temperature,
said dry etching process being a process of forming an n-type polysilicon gate electrode and a p-type polysilicon gate electrode on a gate insulation film,
said first step comprising the step of forming a first polysilicon pattern corresponding to said n-type polysilicon gate electrode by dry etching an n-type polysilicon film on an insulation film constituting said gate insulation film until said gate insulation film is exposed and simultaneously forming a second polysilicon pattern corresponding to said p-type polysilicon gate electrode by dry etching a p-type polysilicon film on said insulation film until said gate insulation film is exposed,
said second step comprising the step of overetching said first and second polysilicon patterns.

12. The method as claimed in claim 1, wherein said trench is formed in an n-type well formed on a surface of said silicon substrate.

13. The method as claimed in claim 1, wherein said trench is formed in an n-type well and a p-type well on a surface of said silicon substrate simultaneously.

14. A dry etching method forming a shallow trench device isolation structure, in which a device isolation trench in a silicon substrate is filled with an insulation film, said method comprising forming said device isolation trench in said silicon substrate by a dry etching process of said silicon substrate, and filling the insulation film in the device isolation trench,
wherein said dry etching process comprises: a first step conducted at a first temperature; and
a second step conducted at a second temperature, said first and second steps being conducted by an etching gas containing at least one gas specie selected from the group consisting of HBr, HCl, $Cl_2$, $Br_2$ and HI, wherein a deposition gas containing one or both of oxygen and sulfur is added to said etching gas, wherein said second temperature is lower than said first temperature, said first step of said dry etching process forming a first trench part in said silicon substrate in correspondence to said device isolation trench, said second step of said dry etching process forming a second, tapered trench part at a bottom of said first trench part, said second trench part forming a shallower angle than said first trench part with regard to a surface of said silicon substrate and having a tapered shape, said second trench part having a second width at a bottom thereof such that said second width is smaller than a first width at said bottom of said first trench part.

15. The method as claimed in claim 11, wherein said polysilicon gate electrode comprises n-type polysilicon.